United States Patent
Wang et al.

(10) Patent No.: US 10,042,222 B2
(45) Date of Patent: Aug. 7, 2018

(54) TEST DEVICE AND METHOD OF MANUFACTURING THE SAME, DISPLAY APPARATUS

(71) Applicants: BOE Technology Group Co., Ltd., Beijing (CN); Beijing BOE Display Technology Co., Ltd., Beijing (CN)

(72) Inventors: Dongliang Wang, Beijing (CN); Xi Chen, Beijing (CN); Zhenyu Zhang, Beijing (CN); Linlin Wang, Beijing (CN); Bin Feng, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 223 days.

(21) Appl. No.: 14/744,110

(22) Filed: Jun. 19, 2015

(65) Prior Publication Data
US 2016/0275836 A1 Sep. 22, 2016

(30) Foreign Application Priority Data

Mar. 20, 2015 (CN) .......................... 2015 1 0126271

(51) Int. Cl.
*G01R 31/26* (2014.01)
*G02F 1/1362* (2006.01)
*H01L 27/12* (2006.01)

(52) U.S. Cl.
CPC .......... *G02F 1/1362* (2013.01); *H01L 27/124* (2013.01); *H01L 27/1259* (2013.01); *G02F 2001/136254* (2013.01)

(58) Field of Classification Search
CPC .. G09G 3/006; G09G 3/3233; G01R 31/2635; G01R 31/00; G01R 31/002; H04N 9/3191
See application file for complete search history.

(56) References Cited

U.S. PATENT DOCUMENTS 5,012,314 A * 4/1991 Tobita ................... G02F 1/1309
250/205
5,288,433 A * 2/1994 Stevens ................. G02F 1/1525
252/583

(Continued)

FOREIGN PATENT DOCUMENTS

CN 101387801 A 3/2009
CN 101561591 A 10/2009

(Continued)

OTHER PUBLICATIONS

Second Office Action from Chinese Patent Application No. 201510126271.6, dated Oct. 19, 2017, 9 pages.

(Continued)

*Primary Examiner* — Tung X Nguyen
*Assistant Examiner* — Dominic Hawkins
(74) *Attorney, Agent, or Firm* — Westman, Champlin & Koehler, P.A.

(57) ABSTRACT

The present invention discloses a test device, a method of manufacturing the test device, and a display apparatus. The test device comprises a first test electrode and a second test electrode. The first test electrode is configured to electrically connect with an electrode layer of an array substrate, and the electrode layer is a gate electrode layer or a source-drain electrode layer. The second test electrode is configured to electrically connect with a first transparent conductive layer provided on the array substrate, and the first transparent conductive layer is electrically connected to a second transparent conductive layer provided on a color film substrate. Thereby, it is possible to test liquid crystal characteristics of the whole liquid crystal display panel by applying a DC voltage through the first test electrode and the second test electrode. Thereby, the test of the whole liquid crystal display panel may be directly finished under factory conditions without using the small liquid crystal test box or the (Continued)

like self-made in a laboratory. In this way, the testing result becomes more accurate, the testing process becomes more rapid, and the testing cost becomes lower.

13 Claims, 2 Drawing Sheets

(56) References Cited

U.S. PATENT DOCUMENTS

| | | | | |
|---|---|---|---|---|
| 6,052,172 | A * | 4/2000 | Kajiwara | G02F 1/1309 349/149 |
| 8,368,417 | B2 | 2/2013 | Li et al. | |
| 9,240,361 | B2 | 1/2016 | Zhang | |
| 9,576,866 | B2 | 2/2017 | Zhang | |
| 9,671,655 | B2 | 6/2017 | Zhao | |
| 2005/0099587 | A1 * | 5/2005 | Hsuan | G02F 1/1309 349/192 |
| 2007/0170949 | A1 * | 7/2007 | Pak | G09G 3/006 324/760.01 |
| 2007/0182318 | A1 * | 8/2007 | Kumaki | H01L 27/3209 313/506 |
| 2008/0180592 | A1 * | 7/2008 | Yu | G09G 3/006 349/54 |
| 2009/0170230 | A1 * | 7/2009 | Kidu | H01L 27/3211 438/35 |
| 2010/0066954 | A1 * | 3/2010 | Wang | G02F 1/133514 349/106 |
| 2010/0238386 | A1 * | 9/2010 | Yin | H01J 9/50 349/106 |
| 2012/0002145 | A1 * | 1/2012 | Lee | G02F 1/136204 349/106 |
| 2012/0262653 | A1 * | 10/2012 | Shimizu | G02F 1/133707 349/106 |
| 2014/0203835 | A1 * | 7/2014 | Ro | G09G 3/006 324/760.02 |
| 2014/0300649 | A1 * | 10/2014 | Park | G09G 3/006 345/690 |
| 2014/0346458 | A1 * | 11/2014 | Park | H01L 27/1259 257/40 |
| 2015/0168799 | A1 * | 6/2015 | Emori | G02F 1/167 324/750.01 |
| 2015/0185569 | A1 * | 7/2015 | Liao | G02F 1/133345 349/39 |
| 2016/0259193 | A1 * | 9/2016 | Yang | G06F 3/041 |

FOREIGN PATENT DOCUMENTS

| | | |
|---|---|---|
| CN | 101661169 A | 3/2010 |
| CN | 102944959 A | 2/2013 |
| CN | 103217840 A | 7/2013 |

OTHER PUBLICATIONS

First Office Action for Chinese Patent Application No. 201510126271.6, dated Apr. 13, 2017, 12 pages.
Third Office Action, including Search Report, for Chinese Patent Application No. 201510126271.6, dated Apr. 25, 2018, 14 pages.

* cited by examiner

TEST DEVICE AND METHOD OF MANUFACTURING THE SAME, DISPLAY APPARATUS

CROSS-REFERENCE TO RELATED APPLICATION

This application claims the benefit of Chinese Patent Application No. 201510126271.6 filed on Mar. 20, 2015 in the State Intellectual Property Office of China, the whole disclosure of which is incorporated herein by reference.

BACKGROUND OF THE INVENTION

Field of the Invention

Embodiments of the present invention relates to a display technology field, more particularly, relates to a test device and a method of manufacturing the test device, and a display apparatus.

Description of the Related Art

In an industry of manufacturing a Thin-Film-Transistor-Liquid-Crystal-Display (referred to as TFT-LCD), it often involves defective products due to pollution of material and process. Timely and accurately analyzing reasons leading to the defective products and proposing solutions are very important to improve the quality of products, save manufacturing cost and increase profit.

The main parameters to evaluate pollution of a liquid crystal display panel comprise Voltage Holding Ratio (referred to as VHR), Ion Density, residual DC voltage (referred to as RDC), etc. In order to test liquid crystal characteristics of the whole liquid crystal display panel, it is necessary to apply a DC voltage on the whole liquid crystal display panel. Unfortunately, it is impossible in the prior art to apply the DC voltage on the whole liquid crystal display panel, and a testing method in the prior art can test only a part of the whole liquid crystal display panel. Thereby, the testing data obtained by such testing method is not the data of the whole liquid crystal display panel, and there are some errors between them. Another testing method in the prior art is to test a small liquid crystal test box (or referred to as Minicell) self-made in a laboratory by simulating factory mass production conditions. However, it is impossible to obtain the liquid crystal test box on the same conditions as the factory due to laboratory conditions and equipment limitations. Moreover, there is large human pollution, and the testing result is not accurate and lacks practical significance.

SUMMARY OF THE INVENTION

The present invention has been made to overcome or alleviate at least one aspect of the above mentioned disadvantages.

According to an aspect of the present invention, there is provided a test device for testing a liquid crystal display panel, comprising: a first test electrode configured to electrically connect with an electrode layer of an array substrate, wherein the electrode layer being a gate electrode layer or a source-drain electrode layer; and a second test electrode configured to electrically connect with a first transparent conductive layer provided on the array substrate, wherein the first transparent conductive layer electrically connected to a second transparent conductive layer provided on a color film substrate.

According to another aspect of the present invention, there is provided a display apparatus comprising the above test device.

According to another aspect of the present invention, there is provided a method of manufacturing a test device, comprising steps of:

forming a first test electrode electrically connected to an electrode layer of an array substrate, wherein the electrode layer being a gate electrode layer or a source-drain electrode layer;

forming a second test electrode electrically connected to a first transparent conductive layer provided on the array substrate; and electrically connecting the first transparent conductive layer on the array substrate to a second transparent conductive layer on a color film substrate during assembling the array substrate and the color film substrate together.

BRIEF DESCRIPTION OF THE DRAWINGS

The above and other features of the present invention will become more apparent by describing in detail exemplary embodiments thereof with reference to the accompanying drawings, in which.

Figure 1:
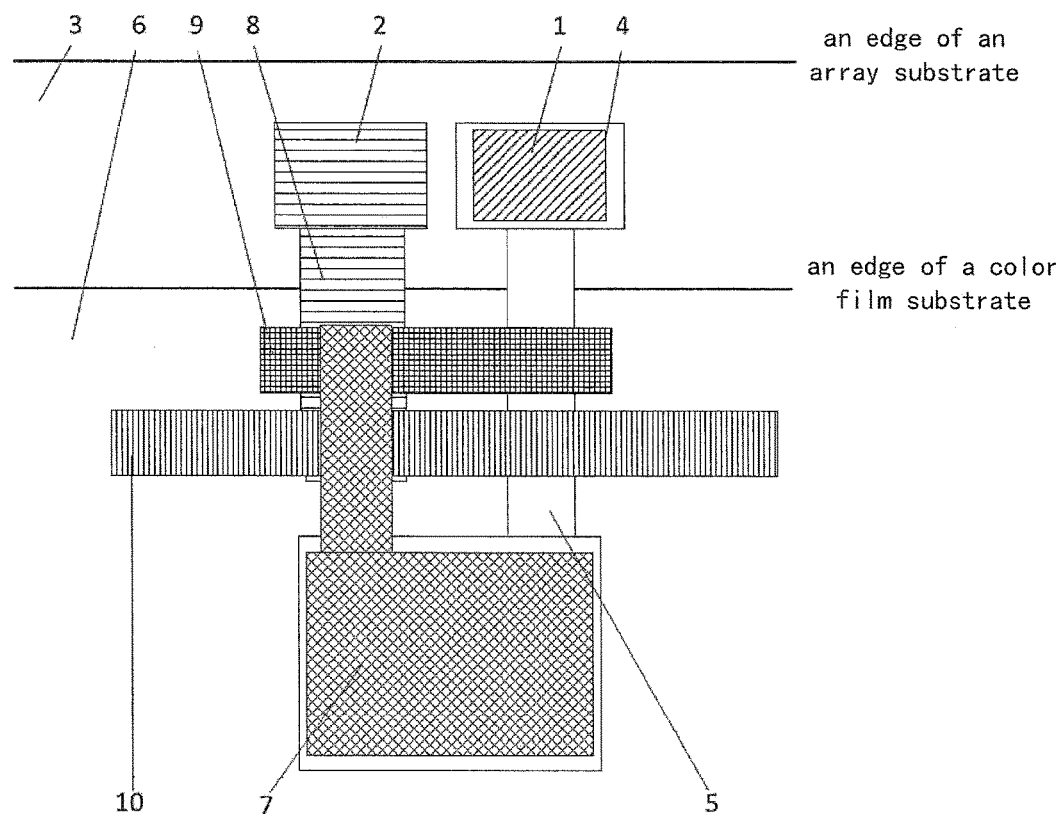
FIG. 1 is an illustrative structure view of a test device according to an exemplary embodiment of the present invention.

In which, reference numbers are listed as below:
1. First test electrode; 2. Second test electrode; 3. Array substrate;
4. Via; 5. Electrode layer; 6. Color film substrate;
7. Second transparent conductive layer;
8. First transparent conductive layer;
9. Conductive medium; 10. Sealant; 11. Insulation medium; 12. Substrate.

DETAILED DESCRIPTION OF PREFERRED EMBODIMENTS OF THE INVENTION

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is an illustrative structure view of a test device according to an exemplary embodiment of the present invention. As shown in FIG. 1, the test device comprises a first test electrode 1 and a second test electrode 2 provided on an array substrate 3.

The first test electrode 1 is electrically connected to an electrode layer 5 of the array substrate 3, and the electrode layer 5 is a gate electrode layer or a source-drain electrode layer. The second test electrode 2 is electrically connected to a first transparent conductive layer 8 provided on the array substrate 3, and the first transparent conductive layer 8 is electrically connected to a second transparent conductive layer 7 provided on a color film substrate 6.

In an exemplary embodiment of the present invention, the first test electrode 1 is electrically connected to the gate electrode layer or the source-drain electrode layer 5 through a via 4.

In an embodiment, the first transparent conductive layer 8 is connected to the second transparent conductive layer 7 through a conductive medium 9.

In the above test device, the first test electrode and the second test electrode are provided on the array substrate. Thereby, it is possible to test liquid crystal characteristics of the whole liquid crystal display panel by applying a DC voltage through the first test electrode and the second test electrode provided on the array substrate. Thereby, the test of the whole liquid crystal display panel may be conducted directly under factory conditions without using the small liquid crystal test box or the like self-made in laboratory. In this way, the testing result becomes more accurate, the testing process becomes more rapid, and the testing cost becomes lower.

In an embodiment, the first transparent conductive layer 8 and the second transparent conductive layer 7 are made of indium tin oxide (ITO).

In an embodiment, the above conductive medium 9 comprises a conductive sealant. In order to better electrically connecting the first transparent conductive layer on the array substrate to the second transparent conductive layer on the color film substrate, the conductive sealant, for electrically connecting the first transparent conductive layer and the second transparent conductive layer, is doped with metal conductive material. For instance, the metal conductive material may comprise metal balls or metal particles.

The gate electrode layer or source-drain electrode layer 5 is configured to have a hollow structure in a region corresponding to the conductive sealant 9, so that the conductive sealant is easily radiated by an ultraviolet (UV) light and cured.

In an exemplary embodiment, in order not to interfere the assembly of the array substrate and test substrate and not to affect the display of the display panel, the first test electrode 1 and the second test electrode 2 are provided in a non-display zone of the array substrate. In an embodiment, an edge of the array substrate is beyond an edge of the color film substrate, and the first test electrode 1 and the second test electrode 2 are provided in an edge zone of the array substrate beyond an edge zone of the color film substrate. In other words, as shown in FIG. 1, the color film substrate and the array substrate are laminated with one on the other, the edge of the array substrate is outside the edge of the color film substrate, and the first test electrode and the second test electrode are provided in the edge zone of the array substrate outside the color film substrate. The position relationship between the array substrate and the color film substrate will not be further described herein.

In an exemplary embodiment, the first test electrode, the second test electrode and the first transparent conductive layer are simultaneously formed by a single patterning process. In this way, no additional electrode manufacturing process is necessary. Of course, the first test electrode and the second test electrode may be manufactured as an additional electrode layer.

In the above test device shown in FIG. 1, a non-conductive sealant 10, for fixing the array substrate and the color film substrate, is further provided between the first transparent conductive layer 8 on the array substrate 3 and the second transparent conductive layer 7 on the color film substrate 6.

Figure 2:
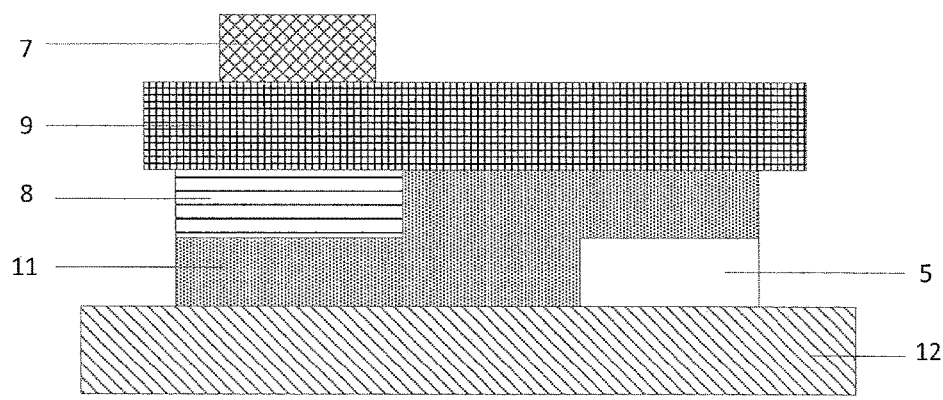
FIG. 2 is an illustrative cross sectional view of a test device taken at conductive medium according to an exemplary embodiment of the present invention.

FIG. 2 is an illustrative cross sectional view of a test device taken at a conductive medium 9 according to an exemplary embodiment of the present invention. As shown in FIG. 2, the first transparent conductive layer 8 is electrically isolated from the gate electrode layer or source-drain electrode layer 5 provided on a substrate 12 by an insulation medium 11 provided between the first transparent conductive layer 8 and the gate electrode layer or source-drain electrode layer 5. Herein, it is not necessary to specially define the material of the insulation medium.

In another embodiment, the above conductive medium 9 may be a conductive spacer, and the first transparent conductive layer on the array substrate may be electrically connected to the second transparent conductive layer on the color film substrate by means of the conductive spacer.

Correspondingly, in the illustrative cross sectional view of the test device taken at the conductive medium 9 as shown in FIG. 2, the first transparent conductive layer 8 is electrically isolated from the gate electrode layer or source-drain electrode layer 5 provided on a substrate 12 by an insulation medium 11 provided between the first transparent conductive layer 8 and the gate electrode layer or source-drain electrode layer 5. Herein, it is not necessary to specially define material of the insulation medium.

As for the above test device, it can accurately test the liquid crystal characteristics of the whole liquid crystal display panel without needing to test the small liquid crystal test box self-made in a laboratory by simulating factory mass production conditions. Thereby, it avoids the human pollution due to laboratory conditions and equipment limitations which can not realize factory conditions, and improves the test accuracy.

Figure 3:
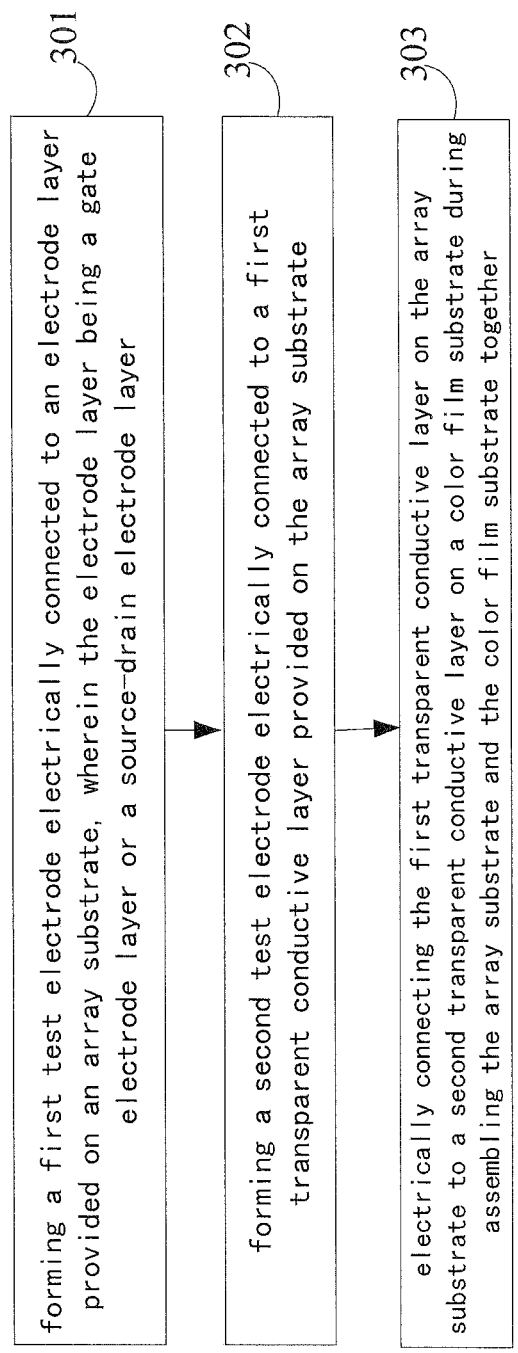
FIG. 3 is an illustrative flow chart of a method of manufacturing a test device according to an exemplary embodiment of the present invention.

FIG. 3 is an illustrative flow chart of a method of manufacturing a test device according to an exemplary embodiment of the present invention. As shown in FIG. 3, the method of manufacturing the test device comprises steps of:

301 forming a first test electrode 1 electrically connected to an electrode layer 5 of an array substrate 3, wherein the electrode layer 5 being a gate electrode layer or a source-drain electrode layer;

302 forming a second test electrode 2 electrically connected to a first transparent conductive layer 8 provided on the array substrate 3; and 303 electrically connecting the first transparent conductive layer 8 on the array substrate 3 to a second transparent conductive layer 7 on a color film substrate 6 during assembling the array substrate 3 and the color film substrate 6 together.

In the above method, the first test electrode and the second test electrode are formed on the array substrate. Thereby, it is possible to obtain liquid crystal characteristics of the whole liquid crystal display panel by applying a DC voltage through the first test electrode and the second test electrode provided on the array substrate, obtaining an accurate test result.

In an embodiment, the first test electrode is electrically connected to the electrode layer through a via formed in the array substrate.

In an embodiment, the first test electrode is formed on the array substrate after forming the via in the array substrate.

In an embodiment, the first test electrode, the second test electrode and the first transparent conductive layer are simultaneously formed by a single patterning process after forming a first transparent conductive material layer.

In an embodiment, the first transparent conductive material layer may be formed by vacuum depositing or magnetron sputtering. The first test electrode, the second test electrode and the first transparent conductive layer may be formed by the patterning process, for example, by etching.

Since the first test electrode, the second test electrode and the first transparent conductive layer are simultaneously formed by the single patterning process, it reduces the number of patterning processes. However, the present invention is not limited to this, the first test electrode and the second test electrode may be formed on an additional electrode layer.

In an embodiment, when providing a sealant, a part of the sealant is provided as a conductive sealant, so as to electrically connect the first transparent conductive layer on the array substrate to the second transparent conductive layer on the color film substrate by means of the conductive sealant; or a part of conductive spacer is provided when providing the spacer, so as to electrically connect the first transparent conductive layer on the array substrate to the second transparent conductive layer on the color film substrate by means of the conductive spacer.

In another embodiment, there is also provided a display apparatus comprising the above test device.

For instance, the above display apparatus may comprise any apparatus with display function, such as, a TV, a computer, a panel computer, a mobile telephone, and so on.

In the test device, the method of manufacturing the test device and the display apparatus disclosed in the above embodiments of the present invention, it is possible to test liquid crystal characteristics of the whole liquid crystal display panel by applying a DC voltage through the first test electrode and the second test electrode provided on the array substrate. Thereby, the test of the whole liquid crystal display panel may be directly finished under factory conditions without using the small liquid crystal test box or the like self-made in a laboratory. In this way, the testing result becomes more accurate, the testing process becomes more rapid, and the testing cost becomes lower.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A test device for testing a liquid crystal display panel, the liquid crystal display panel comprising an array substrate provided with an electrode layer which is a gate electrode layer or a source-drain electrode layer, and a color film substrate, where the test device comprises:
   a first test electrode configured to electrically connect with the electrode layer of the array substrate;
   a first transparent conductive layer which is provided on the array substrate;
   a second transparent conductive layer which is provided on a color film substrate; and
   a second test electrode configured to electrically connect with the first transparent conductive layer provided on the array substrate, wherein the first transparent conductive layer electrically connected to a second transparent conductive layer provided on a color film substrate,
   wherein the first transparent conductive layer is connected to the second transparent conductive layer through a conductive medium; and
   wherein an insulator is provided between the first transparent conductive layer and the electrode layer.

2. The test device according to claim 1, wherein the first test electrode is electrically connected to the electrode layer through a via.

3. The test device according to claim 1, wherein the first transparent conductive layer and the second transparent conductive layer are made of indium tin oxide.

4. The test device according to claim 1, wherein the conductive medium comprises a conductive sealant or a conductive spacer.

5. The test device according to claim 4, wherein the conductive sealant is doped with metal conductive material.

6. The test device according to claim 4, wherein the electrode layer is configured to have a hollow structure in a region corresponding to the conductive sealant.

7. The test device according to claim 1, wherein the first test electrode and the second test electrode are provided in a non-display zone of the array substrate.

8. The test device according to claim 7, wherein the first test electrode and the second test electrode are provided in an edge zone of the array substrate.

9. The test device according to claim 1, wherein the first test electrode, the second test electrode and the first transparent conductive layer are formed by a single patterning process.

10. A display apparatus, wherein the display apparatus is provided with the test device according to claim 1 which is built therein.

11. A method of manufacturing a test device for testing a liquid crystal display panel, the liquid crystal display panel comprising an array substrate provided with an electrode layer which is a gate electrode layer or a source-drain electrode layer, and a color film substrate, where the method comprises steps of:
   forming a first test electrode electrically connected to an electrode layer of an array substrate;
   forming a first transparent conductive layer which is provided on the array substrate;
   providing an insulator between the first transparent conductive layer and the electrode layer;

forming a second transparent conductive layer which is provided on a color film substrate;

forming a second test electrode electrically connected to a first transparent conductive layer provided on the array substrate; and electrically connecting the first transparent conductive layer on the array substrate to a second transparent conductive layer on a color film substrate during assembling the array substrate and the color film substrate together, wherein the first transparent conductive layer on the array substrate is electrically connected to the second transparent conductive layer on the color film substrate through a conductive sealant; or the first transparent conductive layer on the array substrate is electrically connected to the second transparent conductive layer on the color film substrate through a conductive spacer.

12. The method according to claim 11, wherein the first test electrode is electrically connected to the electrode layer through a via formed in the array substrate.

13. The method according to claim 11, wherein
the first test electrode, the second test electrode and the first transparent conductive layer are formed by a single patterning process after forming a first transparent conductive material layer.

* * * * *